United States Patent [19]

Maeda et al.

[11] Patent Number: 5,275,164

[45] Date of Patent: Jan. 4, 1994

[54] MULTI-DIMENSIONAL MAGNETIC RESONANCE IMAGING METHOD AND APPARATUS FOR SAME

[75] Inventors: Akira Maeda, Gardena, Calif.; Koichi Sano, Sagamihara, Japan; Tetsuo Yokoyama, Tokyo, Japan; Hideaki Koizumi, Katsuta, Japan

[73] Assignee: Hitachi, Ltd., Tokyo, Japan

[21] Appl. No.: 386,380

[22] Filed: Jul. 28, 1989

[30] Foreign Application Priority Data

Aug. 10, 1988 [JP] Japan ............................ 63-197918

[51] Int. Cl.$^5$ ............................................ A61B 5/055
[52] U.S. Cl. .................................. 128/653.2; 324/309
[58] Field of Search ................... 128/653.2; 324/387, 324/309, 318, 322, 312; 364/726

[56] References Cited

U.S. PATENT DOCUMENTS

| | | | |
|---|---|---|---|
| 4,721,912 | 1/1988 | Kaufman et al. | 324/309 |
| 4,733,188 | 3/1988 | Sekihara et al. | 324/309 |
| 4,794,337 | 12/1988 | Twieg | 324/312 |
| 4,830,012 | 5/1989 | Reiderer | 324/309 |
| 4,857,846 | 8/1989 | Carlson | 324/309 |
| 4,868,502 | 9/1989 | Hanakawa et al. | 324/309 |
| 4,958,282 | 9/1990 | Barjhoux . | |
| 4,966,149 | 10/1990 | Stokar | 324/309 |

FOREIGN PATENT DOCUMENTS

2617998  7/1987  France .

OTHER PUBLICATIONS

Japanese Journal of Magnetic Resonance in Medicine, vol. 6, Suppl. 2, p. 120, (Sep., 1986), "Clinical Application . . . "

Japanese Journal of Magnetic Resonance in Medicine, p. 104, (Mar. 1987), "0.1 Tesia SIDAC 1H-chemical Shift Imaging".

Japanese Journal of Magnetic Resonance in Medicine, p. 140, (Sep., 1987), "Study for 3-D FFT Method and Displaying Method".

Magnetic Resonance in Medicine, vol. 6, pp. 275-286, (1988), "Time-Resolved Magnetic Resonance Angiography".

Primary Examiner—Kyle L. Howell
Assistant Examiner—Krista M. Pfaffle
Attorney, Agent, or Firm—Pennie & Edmonds

[57] ABSTRACT

A method and apparatus for MRI imaging capable of reducing the time between end of measurement and completion of image reconstruction by performing part of image reconstruction calculation in parallel with measurement of magnetic resonance signals, which particularly performs image reconstruction calculation up to (N−1) dimensions of N-dimensional image reconstruction calculation in parallel with measurement of signals and performs the image reconstruction calculation for the remaining one-dimensional direction after the measurement has been finished. When calculation for the last one dimension is performed, the (N−1)-dimensional images for which image reconstruction has been completed are successively displayed, and the image reconstruction calculation for the remaining one-dimensional direction is carried out not by FFT but by discrete Fourier transform, or such that the order of signal measurement is made in the bit reversed order for the order of phase encoding quantity, and thereby, a further portion of the image reconstruction calculation is carried out in parallel with the signal measurement.

16 Claims, 8 Drawing Sheets

MULTI-DIMENSIONAL MAGNETIC RESONANCE IMAGING METHOD AND APPARATUS FOR SAME

BACKGROUND OF THE INVENTION

1. Field of the Invention

The present invention relates to a computerized tomography system utilizing the nuclear magnetic resonance phenomenon and more particularly to a method and apparatus for magnetic resonance imaging which, in collecting three-dimensional or higher dimensional information by imaging, is capable of shortening the imaging time by effectively performing the process for image reconstruction calculation and enabling the operator to detect in the early stage an abnormality occurring in the course of the imaging due to unexpected movement of the person under inspection or trouble in the apparatus, so that the operability of the apparatus is enhanced.

2. Description of the Prior Art

In magnetic resonance imaging (hereinafter to be referred to as MRI), there have been known methods capable of simultaneously collecting not only two-dimensional tomographic image but also spatial three-dimensional information and further three-dimensional information including chemical shift information or higher dimensional information. As to the method for collecting spatial three-dimensional information, there has been made disclosure, for example, in a literature entitled "Clinical Application of Hexahedron 3-D Fourier Transform" published in Japanese Journal of Magnetic Resonance in Medicine, Vol. 6, Supplement 2, page 120 (September, 1986), or a literature entitled "Study for 3-D FFT Method and Displaying Method" published in Japanese Journal of Magnetic Resonance in Medicine, page 140 (September, 1987). A further example of three-dimensional imaging for spatial two-dimensional information plus chemical shift information, taken as one dimension, is disclosed in a literature entitled "0.1 Tesla SIDAC $^1$H-chemical Shift Imaging" published in Japanese Journal of Magnetic Resonance in Medicine, page 104 (March 1987). By combining these methods, it is of course possible to perform imaging to simultaneously collect four-dimensional or higher dimensional information.

A method is also known, imaging a periodically moving portion such as the heart, as to put the apparatus into synchronism with an electrocardiograph or the like and perform a plurality of excitations during each period of a heartbeat and thereby take images at each timing. An example of this method, is discussed in a literature entitled "Time-Resolved Magnetic Resonance Angiography" published in Magnetic Resonance in Medicine, Vol. 6, pp. 275-286, (1988). According to this method, a plurality of N-dimensional images in a time series are obtained and dynamic imaging is made possible.

In the above described prior arts, both the measurement data of the magnetic resonance signals and calculation amount for reconstructing the N-dimensional image from the data become very large. Hence, to reduce the measurement time of the magnetic resonance signals, various methods are proposed as so-called fast imaging methods. However, there has been no consideration given to the problem that it takes time for processing image reconstructing calculation, and hence, a long waiting time is required after the signal measurement has been finished until the image is obtained. Further, when there occurs unexpected abnormality in the course of measurement of signals, such as deterioration in the picture quality due to movement of the person under inspection or trouble in the apparatus itself, the operator expands considerable time before he finds the trouble. As the result, there have been problems of time wasted for repeating the imaging and therefore the operability of the apparatus is diminished.

SUMMARY OF THE INVENTION

An object of the present invention is to solve the above described problems, i.e., to reduce the time between the end of the signal measurement and the completion of the image reconstruction so that the overall imaging time will be shortened, and further, to enable a portion of the image information taken to be displayed for the operator in the course of signal measurement, to thereby enable the operator to quickly detect abnormality occurring in the process of the measurement, so that the operability of the apparatus will be enhanced.

In order to achieve the above described object, the present invention, in a magnetic resonance imaging apparatus for collecting at least three-dimensional information related to nuclear spins within a predetermined region to be inspected, is characterized by performing image reconstruction calculation up to (N − 1) dimensions, where N is the number of dimensions for collecting information, concurrently with measurement of magnetic resonance signals. Further, the present invention in a magnetic resonance imaging apparatus for collecting at least three-dimensional information related to nuclear spins within a predetermined region to be inspected, is characterized by successively displaying images for which reconstruction has been completed after measurement of magnetic resonance signals has been finished. Further, it, in a magnetic resonance imaging apparatus for collecting plural kinds of at least two-dimensional information in a time-divisional manner related to nuclear spins within a predetermined region to be inspected, is characterized by performing part of reconstruction calculation for each kind of information in parallel with measurement of signals. Still further, it, in a magnetic resonance imaging apparatus for collecting at least two-dimensional information related to nuclear spins within a predetermined region to be inspected, is characterized by successively displaying measured data or result of part or whole of reconstruction calculation made on the measured data concurrently with measurement of magnetic resonance signals.

With the described arrangement, the present invention functions as follows. It is well known that the magnetic resonance signals measured in MRI correspond to spatial frequency components of spatial distribution of nuclear spins, which are the object of the measurement. While the magnetic resonance signals are normally measured with a slope magnetic field, or field gradient, which is temporally constant, applied in a direction, this corresponds to collection of data along a straight line in an N-dimensional spatial frequency domain. By repeating such measuring operations, necessary data for reconstructing the N-dimensional image are collected. The data generally correspond to data within a rectangular parallelepiped within a N-dimensional spatial frequency domain. FIG. 2 shows the case of three dimensions. For simplicity, the description will be limited to the case of three dimensions, but the same will be equally applicable to the case of four or higher dimensions. The case where plural sheets of a periodically moving portion is imaged in synchronism with the period of the movement (hereinafter to be referred to as "dynamic imaging") corresponds to a plurality of the above described N-dimensional spatial frequency domains being measured in parallel. There is also a method known for reducing the signal measuring time by measuring the magnetic resonance signals with a field gradient whose magnitude temporarily charges while applied. The following description is applicable to any of the above described cases.

When image reconstruction is performed by means of three-dimensional Fourier transform, the measured data must be on the lattice points of the rectangular parallelpiped. The three-dimensional data array is generally called a raw data array. Measured data will be represented by F(N, m, l) where $0 \leq n < N$, $0 \leq m < M$, $0 \leq l < L$. With one time of magnetic resonance, data of one line, i.e., the data of $0 \leq n < N$, with n and l fixed is measured. FIG. 3 shows the order of measurement of necessary data for three-dimensional image reconstruction. First, measurement is performed in the order of m=0, 1, ..., M−1 in the plane l=0. Then, similar measurement is performed in the plane l=1, and so on, until measurement is performed in the plane l=L−1.

At this time, it takes time if the three-dimensional Fourier transform is performed after the entire measurement has been finished. According to the method of the invention, after measurement for one line has been finished, one-dimensional FFT for that line (in the direction of suffix n) is calculated before the measurement of the next signal has been measured. While the plane l >0 is measured, a one-dimensional FFT in the direction of suffix n and a one-dimensional FFT in the direction of suffix m for the plane measured immediately before it are calculated. Thus, two-dimensional FFT's in (L−1) sheets of planes are performed concurrently with the measurement of signals. By performing, after the measurement of signals has been finished, two-dimensional FET for the remaining plane l=L−1 and a one-dimensional FFT for suffix l, the reconstruction process of the three-dimensional image can be completed.

In the present method, every time a one-dimensional FFT in suffix l direction is finished after the end of the signal measurement, one line of a final three-dimensional image is obtained. Hence, by successively displaying the date, reconstructed three-dimensional images can be observed in succession. Further, in performing a one-dimensional FET in the suffix l direction, part of the calculation can be performed in parallel with the signal measurement. More particularly, by making the order of measurement in the suffice l direction in the bit reversed order, the butterfly calculation performed by means of the FFT can be successively executed, and thereby, the image reconstructing time after the end of the signal measurement can be shortened.

The image reconstructing time can also be reduced by calculating not an FFT but a discrete Fourier transform for suffix l and calculating partial a sum for the discrete Fourier transform concurrently with the measurement of signals. More particularly, only considering the direction of suffix l, after measuring data F(l₁), the following partial sum S (l) is calculated.

$$S(l) = S(l) + F(l1) \cdot \exp[-2\pi j \, l \, l1/L]. \quad (1)$$

where $0 \leq l < L$. Of course, for the first data, it should be initialized as S(l)=0.

Thus, the calculation amount necessary for image reconstruction in suffix l direction increases from 0 (L logL) to 0 (L²), but, in the above described method, approximately L(L−1) times of calculation of approximately L² times of calculation is performed in parallel with the measurement of signals, and therefore, the calculation amount necessary in the period between the end of the signal measurement and the end of the image reconstruction becomes 0 (L), which is smaller than that in the case of FFT. Accordingly, speed up can be achieved on the whole.

Display of an interim result of the reconstructing calculation while signals are measured is performed, for example, in the following way. First, in the direction of suffix l, the signals are measured from the low frequency component upward. When necessary data are all collected, a one-dimensional FFT in suffix l direction is per formed, whereby two-dimensional image with lowered resolution is reconstructed and it is displayed. As signal measurement is advanced, it becomes possible to successively display images with higher resolution (in suffix l direction). When the suffix l direction is set to be the direction of spatial selective excitation (called "slice direction"), projected data in the slice direction is displayed at first with the image for slice thickness decreasing step by step. Therefore, the operator is able to quickly detect a disturbance in the image caused, for example, by movement of the person under inspection while measuring signals, to thereby take suitable countermeasures such as repeating the measurement.

Also in the case of dynamic imaging, similar processing may be made to a plurality of images corresponding to each timing.

The foregoing and other objects, advantages, manner of operation and novel features of the present invention will be understood from the following detailed description when read in connection with the accompanying drawings.

DETAILED DESCRIPTION OF THE PREFERRED EMBODIMENTS

An embodiment of the present invention will be described below with reference to FIG. 1, FIG. 4 to FIGS. 12(a) and 12(b).

Figure 4:
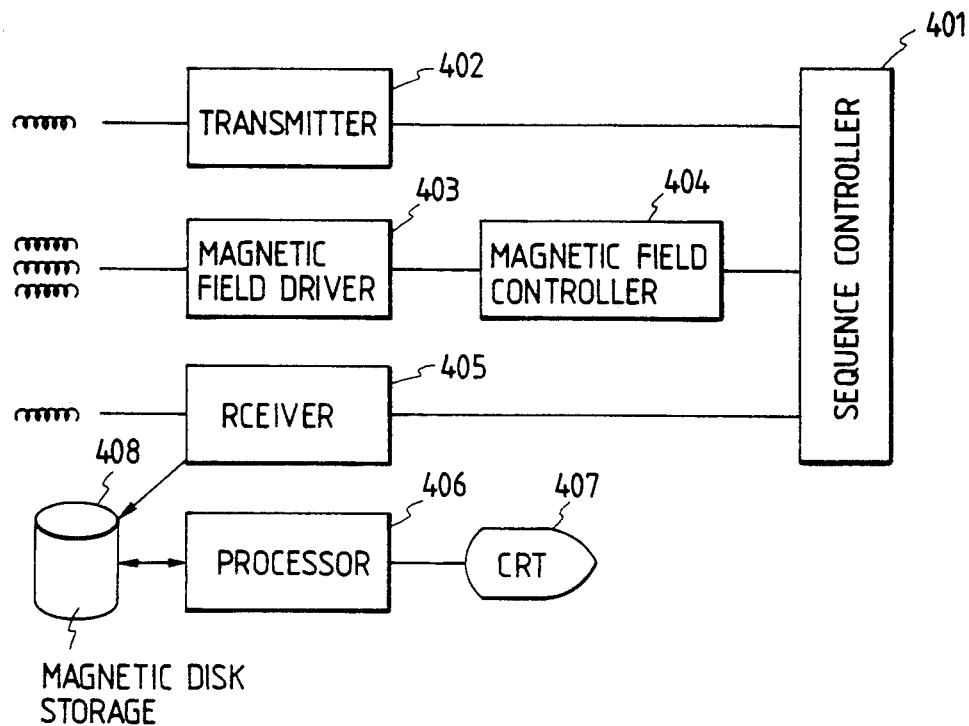
FIG. 4 is a block diagram showing an MRI apparatus for embodying the present invention.

FIG. 4 is a block diagram showing construction of an MRI apparatus for embodying the present invention. The apparatus comprises a sequence controller 401 for controlling various parts of the apparatus in the predetermined sequence for detecting magnetic resonance signals from the part of an object of inspection, a transmitter 402 for generating an RF pulse to cause resonance, a magnetic field driver 403 for driving a field gradient, a magnetic field controller 404 for controlling the magnetic field, a receiver 405 for receiving and detecting magnetic resonance signals generated from the object of inspection, a processor 406 for performing image reconstruction and various calculations, a CRT display 407 for displaying images, and a peripheral memory device 408 for storing detected signal data, reconstructed image data, etc.

Figure 5:
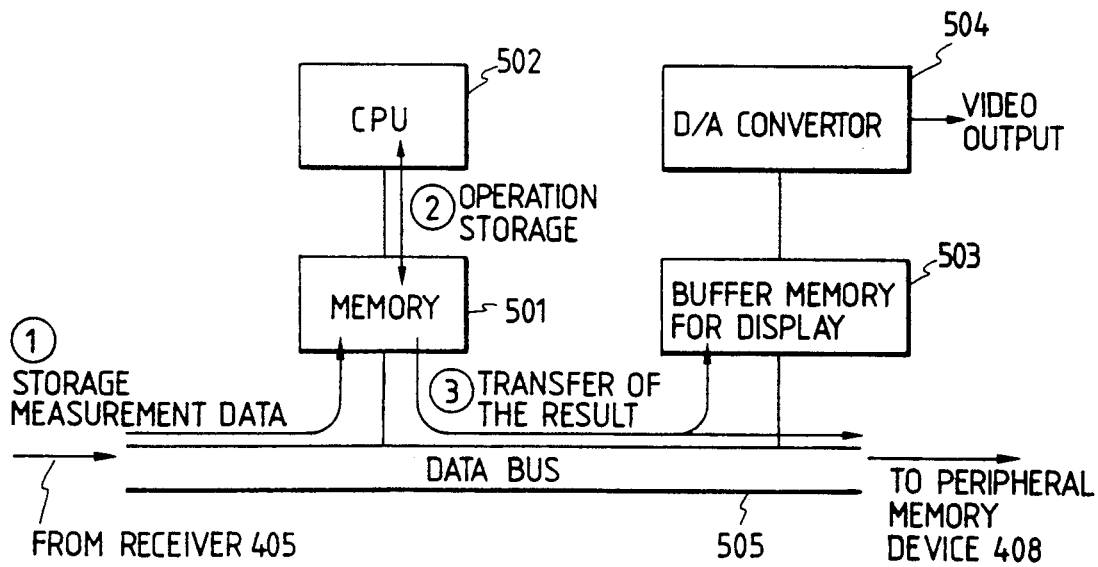
FIG. 5 is a drawing showing details of a processor 406 and a CRT 407 shown in FIG. 4.

FIG. 5 is a diagram showing an internal structure of the processor 406 and the image displaying CRT display 407 shown in FIG. 4. Within the processor 406, there is a memory 501 for storing measured data and reconstructed images and a CPU 502 for performing actual calculations. Within the CRT display 407, there is a buffer memory for displaying 503 for storing data for display and a D/A converter 504. These parts are connected by a data bus 505. Data flow is as follows: Data received by the receiver 405 are first stored in the memory 501 through the data bus 505. The data are subjected to calculations in the CPU 502 and the results are stored again in the memory 501. The results of calculation are transferred to the buffer memory for display 503 or to the peripheral memory device 408 through the data bus 505.

In the described arrangement, it is assumed that the memory 501 has sufficient capacity for storing the whole of N-dimensional measured data and reconstructed image data. For convenience, this memory is considered to be divided into L sheets of memories 501(0), 501(1), 501(L−1). Each memory is assumed to be capable of storing two-dimensional N×M data.

Figure 6:
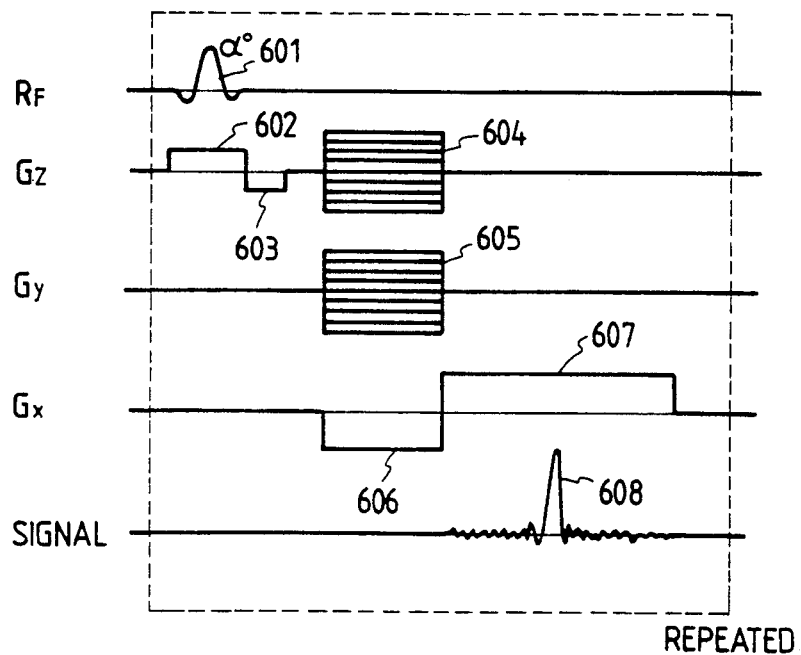
FIG. 6 is a chart showing an example of pulse sequencing for three-dimensional imaging.

FIG. 6 shows an example of a pulse sequence for three-dimensional imaging. First, an RF magnetic field pulse 601 for tilting nuclear spins by $\alpha°$ is applied, together with field gradient pulse 602, in the direction of the z-axis for selectively exciting spins in a slice. The angle $\alpha$ is called a flip angle, which normally has the value from approximately 10 to 60. Then, inverted field gradient pulse 603 is applied along the z-axis to align the phases of the selectively excited spins. Then, phase encoding pulses 604 and 605 are applied for providing information to identify the positions of the spins along the z-axis and y-axis. At the same time as the application of the phase encoding pulses 604 and 605, inverted field gradient pulse 606 is applied in the direction of the x-axis for forming a so-called gradient echo. Thereafter, a magnetic resonance signal 608 is measured, with a field gradient pulse 607 applied in the direction of the x-axis. The above operations are repeated at intervals corresponding to a change of the intensity of the phase encoding pulses 604 and 605.

Figure 1:
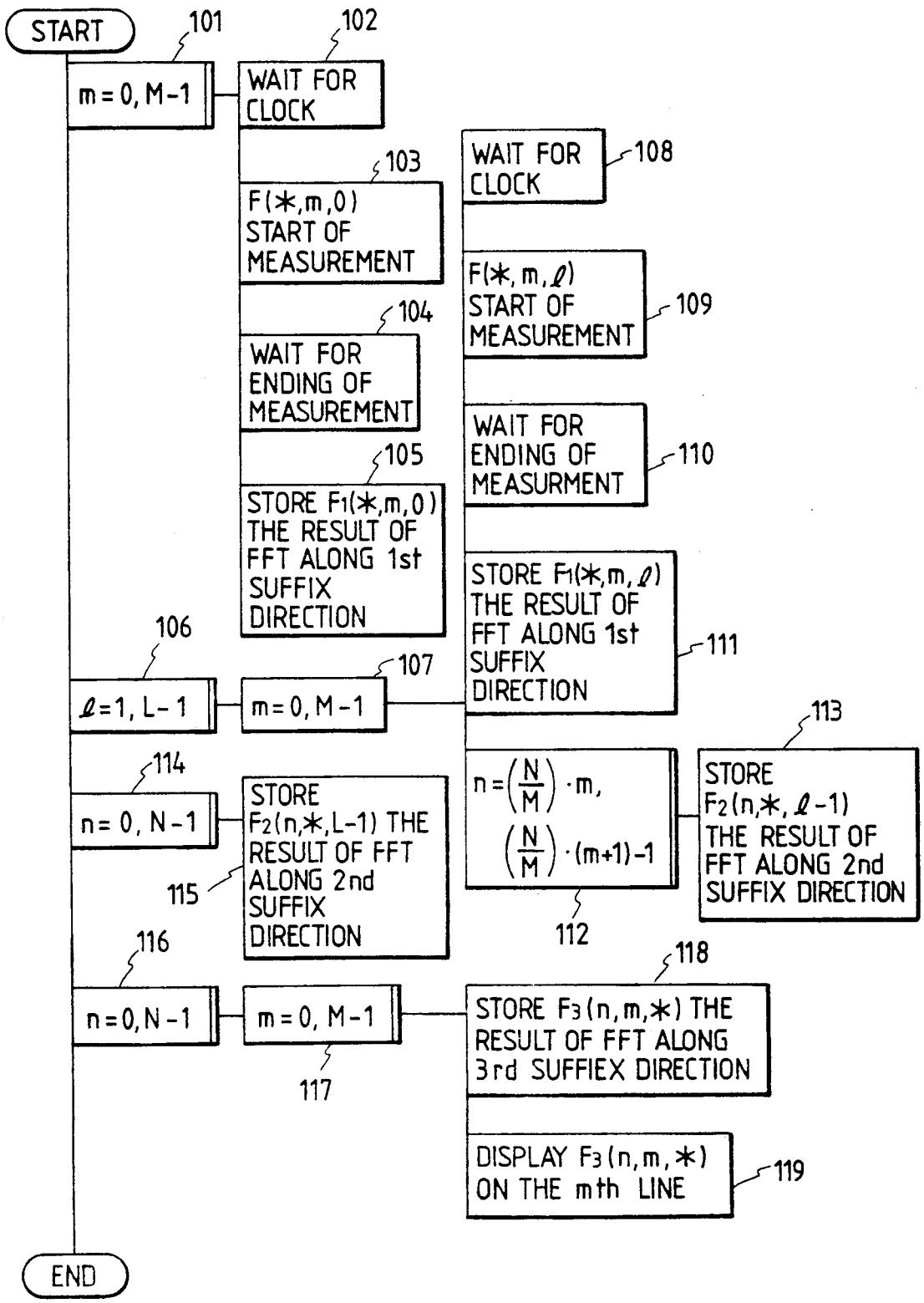
FIG. 1 is a chart showing flow of processing in a first embodiment of the present invention.
Figure 2:
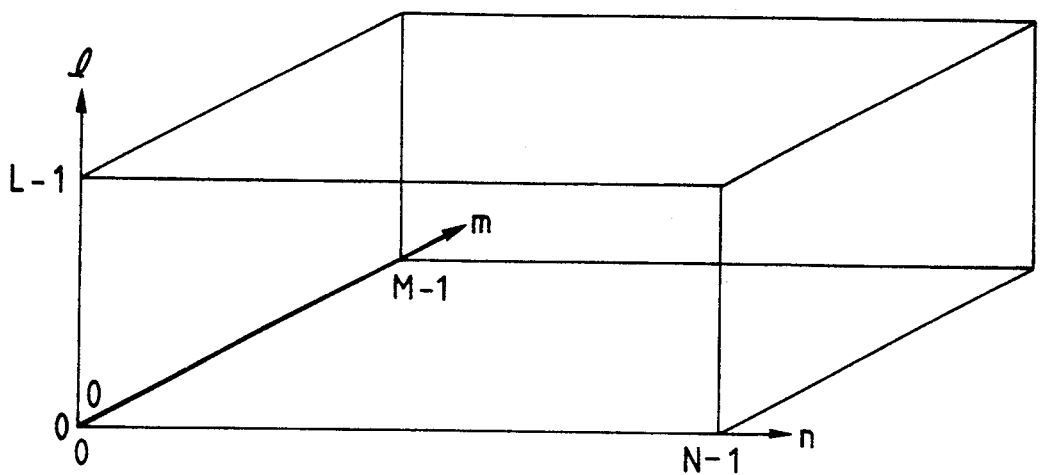
FIG. 2 is a drawing showing the range of data measured in a three-dimensional spatial frequency domain.
Figure 3:
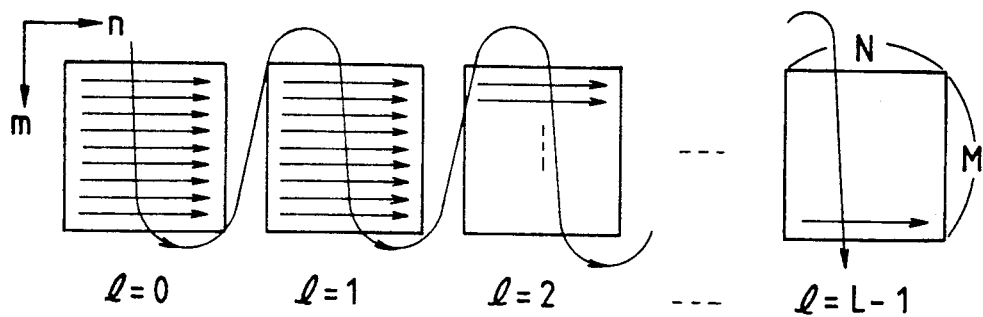
FIG. 3 is a diagram showing an example of order of measurement of the data.

FIG. 1 shows a flow of processing for signal measurement, image reconstruction calculation, and reconstructed image display in a first embodiment of the present invention. In the present embodiment, the case of a three-dimensional image whose number of picture elements is N×M×L is processed is considered.

Process 101 is to repeat processes 102 to 105 M times with the variable m=0 to M−1.

The process 102 consist of waiting for a clock from the apparatus in order to perform measurement of the magnetic resonance signal at a predetermined repetition period.

The process 103 is to start measurement of the signal F(*, m, 0).

The process 104 is to wait for ending of the signal measurement started in the process 103.

In the process 105, FFT ($F_1$(*, m, 0)) in the 1st suffix direction of the signal F(*, M, 0), measured in the processes 103 to 104, is calculated and the result is stored in the mth line of the memory 501(0) of FIG. 5.

The process 106 is to repeat process 107 (L−1), with variable l=1 to L−1.

The process 107 is to repeat processes 108 to 112 M, with variable m=0 to M−1.

The process 108 is to wait for a clock from the apparatus in order to perform measurement of the magnetic resonance signal at a predetermined repetition period.

In the process 109, measurement of the signal F(*, m, l) is started.

The process 110 is to wait for the ending of the signal measurement started in the process 109.

In the process 111, FFT ($F_1$(*, m, l) ) in the 1st suffix direction of the signal F(*, m, l) measured in the processes 109 to 110 is calculated and the result is stored in the mth line of the memory 501(l) of FIG. 5.

In the process 112, process 113 is repeated (N/M) times with variable n=(N/M)×m to (N/M)×(m+1)−1.

In the process 113, FFT ($F_2$(n, *, l−1)) in the 2nd suffix direction is calculated on the data $F_1$(n, *, l−1) that are already measured, Fast-Fourier-Transformed in the first suffix direction, and stored in the memory 501(l−1) of FIG. 5, and the result is stored in the original storage area of the memory.

Process 114 is to repeat process 115 N times from variable n=0 to N−1.

In the process 115, FFT ($F_2$(n, *, L−1)) in the 2nd suffix direction is calculated on the data $F_1$(n, *, L−1) stored in the memory 501 of FIG. 5 and the result is stored in the original storage area of that memory. At this stage, the three-dimensional data array in the memory 501 is a data array having two image space axes and one spatial frequency axis. Such a data array is generally called a hybrid data array.

Process 116 is to repeat process 117 N times, with variable n=0 to N−1.

The process 117 is to repeat processes 118 to 119 M times, with variable m=0 to M−1.

In the process 118, FFT ($F_3$(D, M, in the 3rd suffix direction is calculated on the data $F_2$(n, m, *) Fast-Fourier-Transformed in first and second suffix directions which has been stored in the memory 501, and the result is stored in the original storage area of that memory.

In the process 119, one line of reconstructed image data calculated in the process 118 is transferred to the mth line of the buffer memory for display 503 of FIG. 5 to be displayed.

Through the above described processes, reconstruction of three-dimensional N×M×L image is completed, and further, two-dimensional M×L image data finished with reconstruction are displayed in succession.

According to the present embodiment, most of the two-dimensional Fourier transform for suffixes n and m of the three-dimensional Fourier transform can be executed in parallel with the signal measurement. Therefore, the effect is obtained that the time required from the end of the signal measurement to the completion of the image reconstruction process is reduced and the overall imaging time is shortened. Further, in the process from the end of the signal measurement to the image reconstruction, two-dimensional image data are displayed as soon as calculations therefor have been finished, and therefore, such effects are obtained that the waiting time which is psychologically annoying to the operator can be reduced and operability of the apparatus can be enhanced.

In the foregoing description of the embodiment, the size of the three-dimensional picture was arbitrary. In the case where a three-dimensional picture of the size of $256 \times 256 \times 64$, for example, is taken, by setting $N=256$, $M=64$, $L=256$, it becomes possible to make the size of the picture finally displayed in succession $256 \times 256$. Similarly, when performing three-dimensional imaging with the use of selective excitation pulse, the direction of the selective excitation normally corresponds to the direction of the slice thickness. Therefore, in this case, by changing the phase encoding quantity in the direction of the selective excitation lastly, the cross-section of the two-dimensional image can be brought into coincidence with the slice surface.

In the present embodiment, the case of three-dimensional imaging was addressed but it is of course easy to perform four-dimensional imaging or higher with similar effects as in the above embodiment obtained. The same is true of the case of three-dimensional or higher dimensional imaging that includes the chemical shift axis. Further, by setting the phase encoding order in the suffix 1 direction into agreement with the order of the bit reverse sample ordering used of fast Fourier Transform (FFT), in the suffix 1 direction can be performed in parallel with the signal measurement, and the time for taking picture can be further reduced.

Although the present embodiment was arranged for image reconstruction through a three-dimensional Fourier transform, the system according to the present invention can be easily applied to the method to quickly collect data in the plane defined by $l=$ constant with the use of field gradient varying with time and achieve the image reconstruction by taking the correlation between the reference signal generated in the computer and the measured signal, and, apparently, the same effects as in the present embodiment can thereby be obtained.

Although, in the present embodiment, the case where processes are performed using only the memory 501 was described, if the memory 501 is adapted such that both storing measured data therein and reading the data measured already therefrom are possible, the reconstruction calculation can be carried out at the same time as the signals are measured, whereby the efficiency of use of the CPU 502 can be further enhanced. Similar effects can be obtained by providing a buffer for temporarily storing the measured signal data separately from the memory 501 so that writing data into the buffer and calculation on the data in the memory 501 can be performed simultaneously. The measured data stored in the buffer may be transferred to the memory 501 after the reconstruction calculation.

Figure 7B:
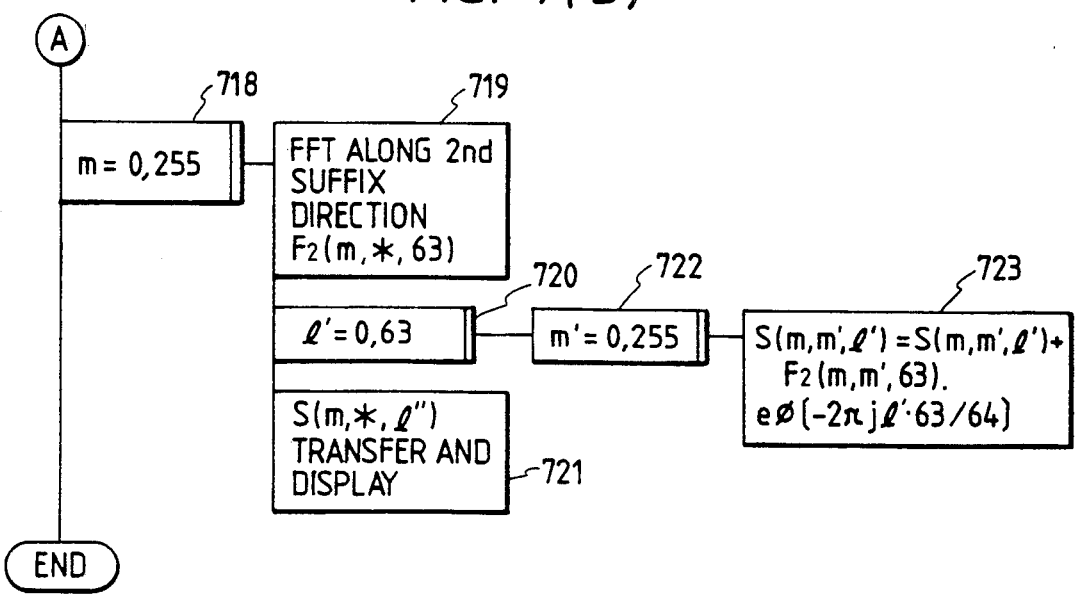
FIGS. 7(a) and 7(b) are charts showing flow of processing in a second embodiment of the present invention.
Figure 7A:
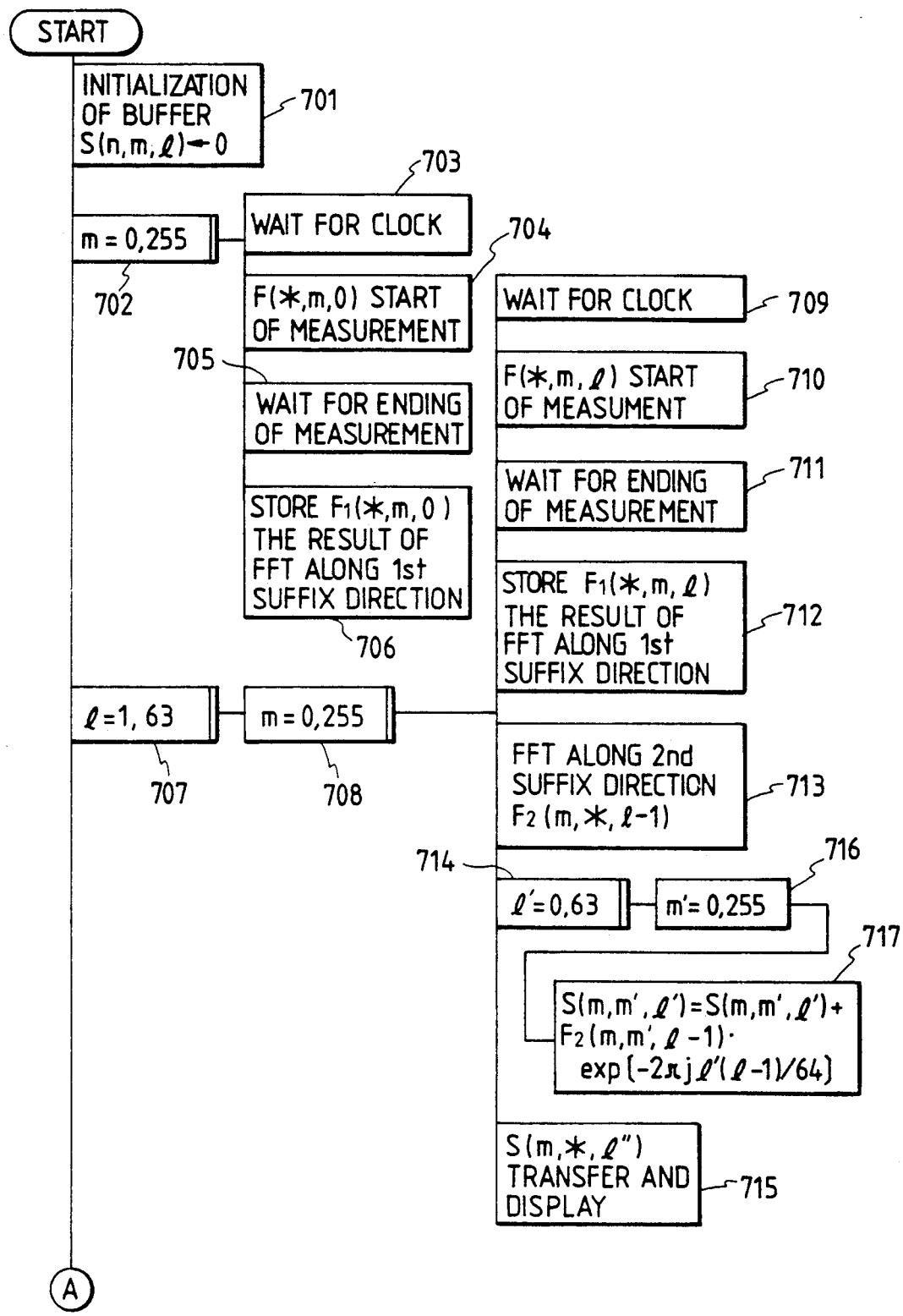

FIGS. 7(a) and 7(b) show flow of processing in a second embodiment of the present invention. In the present embodiment, a one-dimensional Fourier transform in the suffix 1 direction is calculated not by FFT but by discrete Fourier transform, wherein a partial sum of the discrete Fourier transform is calculated concurrently with the signal measurement. Three-dimensional measurement is considered and the number of picture elements of the three-dimensional image is set to be $256 \times 256 \times 64$.

Prior to the measurement, the memory S (n, m, l), where $0 \leq n < 256$, $0 \leq m < 256$, $0 \leq l < 64$, for storing the three-dimensional reconstructed image to be obtained as the result of the processing is subjected to initialization process 701, i.e., zero-cleared.

In process 702, processes 703 to 706 are repeated 256 times with variable $m=0$ to 255.

The process 703 is to wait for a clock from the apparatus in order to perform measurement of the magnetic resonance signals at a predetermined repetition period.

The process 704 is to start measurement of the signal $F(*, m, 0)$.

The process 705 is to wait for ending of the signal measurement started in the process 704.

In the process 706, FFT ($F_1(*, m, 0)$) in the 1st suffix direction of the signal $F(*, m, 0)$ measured in the processes 704 to 705 is calculated and the result is stored in the memory.

In process 707, process 708 is repeated 63 time with variable $l=1$ to 63.

In the process 708, processes 709 to 715 are repeated 256 times with variable $m=0$ to 255.

In the process 709, clock is awaited the same as in the process 703.

In the process 710, measurement of the signal F(n, m, l ) is started ($0 \leq n < 256$).

The process 711 is to wait for an ending of the signal measurement started in the process 710.

In the process 712, FFT ($F_1(*, m, l)$) in the 1st suffix direction of the signal $F(*, m, l)$ measured in the processes 710 to 711 is calculated and the result is stored in the memory.

In the process 713, FFT ($F_2(m, *, l-1)$) in 2nd suffix direction is calculated on the data ($F_1(m, * l-1)$) that are already measured and Fast-Fourier-Transformed in the first suffix direction.

Process 714 is to repeat process 716, 64 times with variable $l'=0$ to 63.

The process 716 is to repeat process 717, 256 times with variable $m'=0$ to 255.

In the process 717, the following calculation is performed.

$$S(m, m', l') = S(m, m', l') + F_2(m, m', l-1) \cdot \exp[-2\pi j\ l'(l-1)/64] \quad (2)$$

In process 715, the result S(m, *, l'') calculated in the process 714 is transferred to the mth line of the display to be displayed thereon. Here, the variable l'' is a constant ($0 \leq l'' < 64$) designated by the operator before starting the signal measurement.

Process 718 is to repeat processes 719 to 721, 256 times with variable $m=0$ to 255. In the process 719, FFT ($F_2(m, *, 63)$) in 2nd suffix direction of $F_1(m, *, 63)$ is calculated.

Process 720 is to repeat process 722, 64 times with variable $l'=0$ to 63.

The process 722 is to repeat process 723, 256 times, with variable m'=0 to 255.

In the process 723, the following calculation is performed.

$$S(m, m', l'') = (m, m', l'') + F_2(m, m', 63) \cdot \exp[-2\pi j \, l''63/64] \quad (3)$$

In the process 721, the result calculated in the process 723, S(m, *, l''), is transferred to the mth line of the display to be displayed thereon.

Through the above processing, the reconstructed three-dimensional image is stored in the memory 503.

According to the present embodiment, most of the two-dimensional FFT and most of the discrete Fourier transform of the remaining one dimension can be executed in parallel with the signal measurement, and hence the time from the end of the signal measurement to the completion of the three-dimensional image reconstruction process can be reduced. The effect is that the overall imaging time is shortened.

Further, since interim results of the reconstruction calculation can be displayed in succession as the signal measurement is advanced, the operator, during the signal measurement, can quickly detect abnormality in the data caused by such things as movement of the person under inspection. The operator can then suitable measures such as, for example, to make measurement once again. Thus, the operability of the apparatus is enhanced and also the waiting time during the signal measurement which is psychologically annoying the operator, is reduced. The same effects as above may be obtained by such arrangement as to display the measurement data themselves or to display partially Fourier transformed results, and such processing can be achieved very easily in the above described embodiment.

In the above described second embodiment, by measuring the signal in the order of phase encoding in the third suffix direction, upward from low frequency components in succession, the result displayed in the middle of the processing can be made to be such an image in which spatial resolution in third suffix direction is reduced. For example, measurement may be made in the order of l = 0, 1, 63(=−1), 2, 62(=−2), In this case, since physical meaning of the displayed interim image is clear, more useful information for the operator can be displayed.

The present invention can be easily applied to the case where the image reconstruction calculation in one of the first or second suffix direction or more is performed not by FFT but by correlation calculation of the reference signal and the measured signal, and therein, the same effects as in the present embodiment can of course be obtained.

By providing the apparatus with a means enabling the operator to designate the constant l'' before starting the measurement, it becomes possible to select the kind of the interim image displayed in the middle of the measurement. By designating l''=0 for example, it becomes possible to display, at all times, the images corresponding to the central position in the third suffix direction of the three-dimensional image as the interim images. It is apparent that this position can be changed by designating other values. Further, the interim image is not limited to one kind, but it is easily achieved to display several kinds of images at the same time.

By further providing the apparatus with a means to change the value of l'' in the middle of the measurement, it is apparent that the kind of the interim image can be changed. Thereby, it becomes possible to trace the portion desired in advance to minutely observe the interim images, and thereby, the operability can be enhanced.

It is also easy to perform the signal measurement and calculation at the same time by providing the apparatus with a buffer to temporarily store the measured data or by partly changing the order of calculations performed in parallel with the signal measurement, and then, the same effects as in the present embodiment can be obtained.

In the image reconstruction calculation after the signal measurement has been finished, it is apparent that the final reconstructed images can be displayed such that the one calculated first may be displayed first by combining the present embodiment with the earlier described first embodiment.

In the above described method, the process of the slice thickness becoming successively smaller is displayed as the interim result, and hence, when the operator stopped the measurement midway, the image of the slice thickness at that time can be utilized. On the other hand, such an effect can also be obtained, when it is determined that an image of thinner slice than that of the value set before starting signal measurement has become necessary, the slice thickness can be changed in the course of measurement, and thereby, the calculation can be continued, without the need for making measurement again from the beginning, It is readily apparent that the display of interim images described in the above second embodiment can also be practiced in the method of the first embodiment. For example, when measurement of suitable low-frequency components has been finished, FFT in the third suffix direction may be performed and the result displayed. In this case, however, additional calculation for making the interim image is required.

Figure 8:
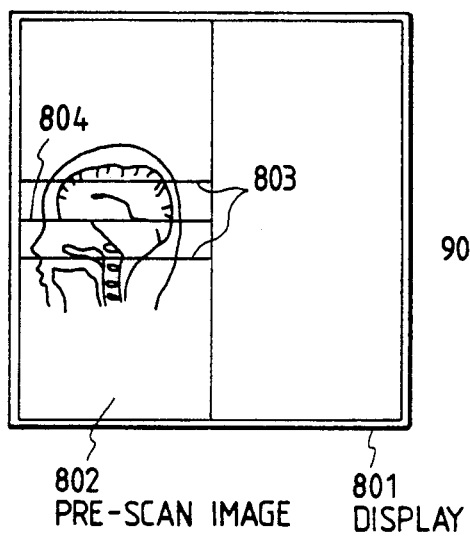
FIG. 8 to FIG. 10 are diagrams showing layout of images displayed on the CRT 407 shown in FIG. 4.
Figure 9:
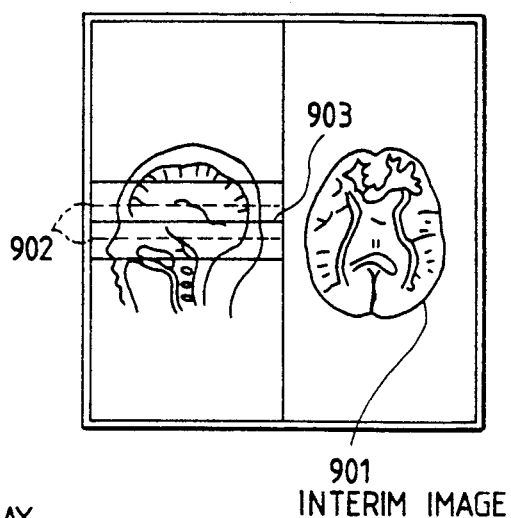
Figure 10:
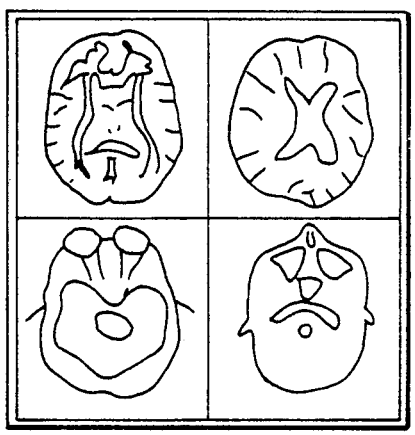

FIG. 8 to FIG. 10 are drawings for explaining a third embodiment of the present invention.

FIG. 8 is a drawing showing a state of the display 407 shown in FIG. 4 before measurement is started. The display 801 is divided into two regions on the left and on the right, and in the left region, there is displayed a pre-scan image 802 for designating the region of which three-dimensional measurement must be made. The operator designates, on the pre-scan image 802, the position of the region to be imaged and that of the image for displaying interim result. In FIG. 8, a pair of cursors 803 (thin solid lines) designate the imaged region and a cursor 804 (thick solid line) indicates the central position of the interim image. Here, the positions of the imaged region and the interim image may be designated, for example, with a trackball.

FIG. 9 shows a state of the display at a time point after measurement has been started with the designation made as shown in FIG. 8. Having the pre-scan image 802 left displayed as it is in the left-hand region, the interim images 901 are successively displayed in the right-hand region. As described with the second embodiment, the interim image 901 becomes that of a smaller slice thickness as the measurement is advanced. During display, the position corresponding to the interim image currently on the display is indicated by a pair of cursors 902 (dotted lines) on the pre-scan image displayed in the left-hand region. Change in the position of the interim image during the measurement is effected by moving the cursors 903 by such means as a trackball.

FIG. 10 shows an example in which interim images at a plurality of positions are simultaneously displayed. Number of displays and positions of displays can of course be designated in the same way as in FIG. 8. It is also easy to switch the image as shown in FIG. 9 to that as shown in FIG. 10 and vice versa by using a suitable means.

Figure 11:
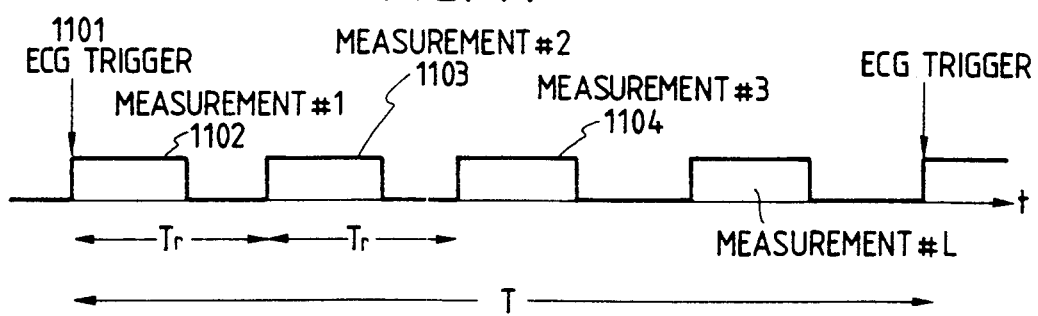
FIG. 11 is a diagram showing an example of pulse sequence for signal measurement in a fourth embodiment of the present invention.

FIG. 11 and FIG. 12 are drawings showing a fourth embodiment of the present invention.

FIG. 11 shows an example of a sequence in which the apparatus synchronizes with an electrocardiograph and performs excitation and measurement a plurality of times within the period of a heartbeat so as to measure two-dimensional images at each time point within the period of the heartbeat in parallel, in a time-divisional manner. Responding to a trigger 1101 from the electrocardiograph, measurement 1102 for the first sheet is started. The method for the measurement may be the same as the sequence shown in FIG. 6. Then, after an interval Tr, measurement 1103 for the second sheet may be made in the same sequence. Further, after another interval Tr, measurement 1104 for the third sheet is performed and so on. For the measurement to be made L times within one period of the heartbeat, L is set to be $L \simeq T/Tr$, where T is the period of the heartbeat and Tr is the interval. Through repetition of the above operations, L sheets of two-dimensional measurement data are obtained.

Figure 12A:
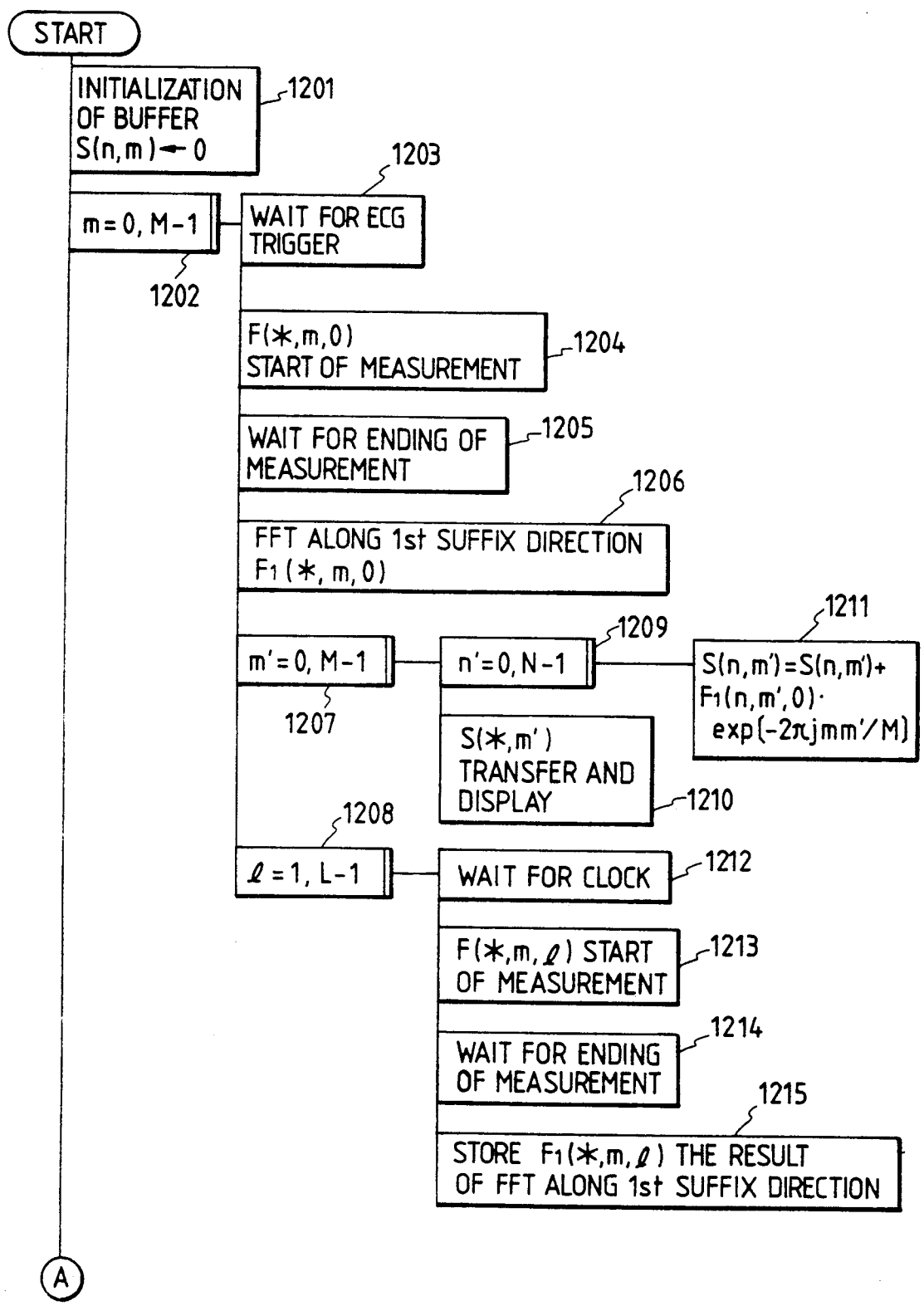
FIGS. 12(a) and 12(b) are charts showing flow of processing in the fourth embodiment.
Figure 12B:
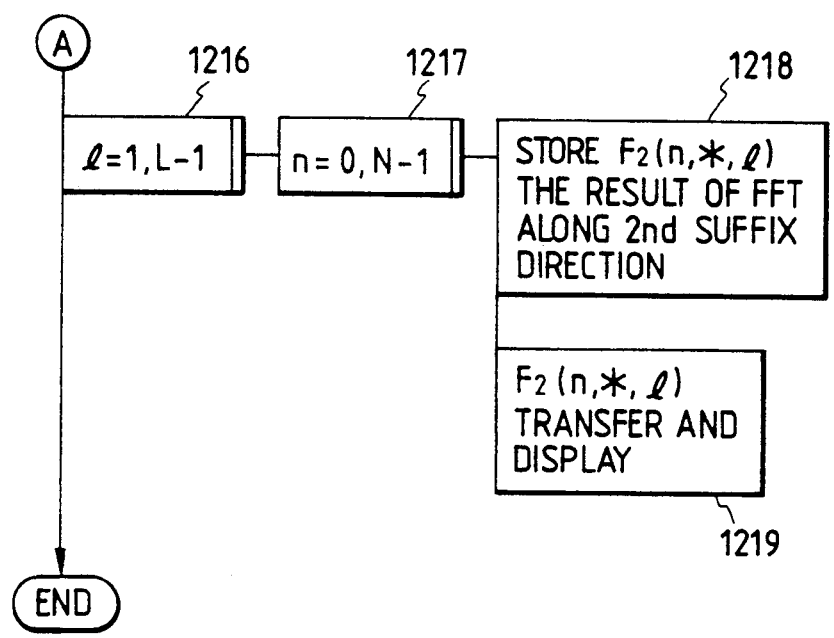

FIGS. 12(a) and 12(b) are charts showing flow of image reconstructing calculation processes in the fourth embodiment.

Ip process 1201, a memory $S(n, m)$, $0 \leq n < N$, $0 \leq m < M$, for storing two-dimensional images for displaying interim results is initialized.

In process 1202, processes 1203 to 1207 are repeated M times from variable $m=0$ to $M-1$.

In the process 1203, a trigger, with the electrocardiograph (ECG) is awaited to obtain synchronism with the heartbeat.

In the process 1204, measurement of the signal $F(*, m, 0)$ is started.

The process 1205 is for awaiting the ending of the signal measurement started in the process 1204.

In the process 1206, $FFT(F_1(*, m, 0))$ in the first suffix direction of the measured signal $F(*, m, 0)$ in the processes 1204 to 1205 is calculated.

In the process 1207, processes 1209 to 1210 are repeated M times with variable $m'=0$ to $M-1$.

In the process 1209, process 1211 is repeated N times with variable $n=0$ to $N-1$.

In the process 1211, the following calculation is performed.

$$S(n, m') = S(n, m') + F_1(n, m', 0) \cdot \exp[-2 \pi j m m'/M] \quad (4)$$

The process 1210 is to transfer the result $S(*, m')$ in the processes 1209 and 1211 to the m'th line of the display to be displayed thereon.

In process 1208, processes 1212 to 1215 are repeated $(L-1)$ times with variable $l=1$ to $L-1$.

In the process 1212, a clock from the apparatus is awaited so as to perform measurement of a magnetic resonance signal at a predetermined interval Tr.

In the process 1213, measurement of signal $F(*, m, l)$ is started.

In the process 1214, the ending of the signal measurement started in the process 1213 is awaited.

In the process 1215, $FFT(F_1(*, m, l))$ in the first suffix direction of the signal $F(*, m, l)$ measured in the steps 1213 to 1214 is calculated and the result is stored in the memory 501.

In process 1216, process 1217 is repeated $(L-1)$ times with variable $l=1$ to $L-1$.

In the process 1217, process 1218 is repeated N times with variable $n=0$ to $N-1$.

In the process 1218, FFT in second the suffix direction of the data $F_1(n, *, l)$ previously measured and Fast-Fourier-Transformed in first suffix direction is calculated and put into storage.

In process 1219, the data obtained in the process 1218 is transferred to the nth line of the display to be displayed thereon.

Through the above described processes, reconstruction of L sheets of two-dimensional images is finished and a first image of an interim result of reconstruction is displayed on the display concurrently with ongoing signal measurement.

According to the present embodiment, in imaging L sheets of images in a time series in synchronism with the electrocardiograph, the interim results are successively displayed. Therefore, the operator is able to quickly detect abnormality in the data occurring in the course of measurement due to movement of the person under inspection or the like.

In the above described embodiment, arrangement was made such that the first interim image is displayed, but it is easy to arrange such that any optional interim image is generally displayed. Synchronized operation is not limited to that with an electrocardiograph, and similar effects may be obtained if it is synchronized with the respiration.

Further, it is easy to display an interim result of reconstruction of each of the L sheets of images. In such a case, the images can be displayed as dynamic picture information by showing the image along with the timing of its measurement, whereby more detailed information can be given to the operator.

Also, in the above described embodiment, it is possible to combine it with the method described in the first or second embodiment and thereby obtain the same effects.

According to the present invention, in imaging an N-dimensional image ($N \leq 3$), or in imaging a plurality of N-dimensional images ($N \leq 2$) in parallel, in magnetic resonance imaging, most of the image reconstruction calculation can be carried out concurrently with the measurement of the magnetic resonance signals, and hence, the time between the end of the signal measurement and the end of the image reconstruction can be reduced and overall imaging time can be shortened. Further, in the image reconstruction after the end of the signal measurement, it is made possible to successively display the images of which reconstruction bas been finished, whereby the waiting time which is psychologically annoying to the operator, is be decreased and operability of the apparatus is enhanced.

Furthermore, in the course of signal measurement, the measured data, or the result of reconstruction calculation partly or wholly made on the measure data can be successively displayed, the operator can quickly detect abnormality in the image occurring in the course of measurement and the operability of the apparatus can thereby be enhanced.

What is claimed is:

1. A magnetic resonance imaging method for obtaining multi-dimensional image data of an object laid in a space to which a static magnetic field is applied, said multi-dimensional image data being resolved along at least three image axes selected from among the three axes of the space and a chemical shift axis, a magnetic resonance imaging method comprising steps of:

a) performing a measuring sequence including steps of:

i) exciting nuclear spins, by generating RF pulses through a transmitting means, in a region within the space for plural times, the region being established by a magnetic field driving means in response to a magnetic field controlling means, and ii) measuring by a measuring means, nuclear magnetic resonance signals emitted by said excited nuclear spins, said magnetic resonance signals being received through a receiving means and measured by a processing means, for plural times to successively obtain a three-dimensional raw data array on a spatial frequency domain, three spatial frequency axes of the raw data array respectively corresponding to three-dimensional image axes of said at least three image axes, and the steps of exciting nuclear spins and measuring nuclear magnetic spins plural times succeeding in a plane-to-plane order in which measurements for obtaining raw data on a present plane along a first and a second spatial frequency axes are begun after measurements for obtaining raw data on a preceding plane are finished; and b) performing a three-dimensional Fourier transformation sequence to form the multi-dimensional image data, the three-dimensional Fourier transformation sequence including steps of iii) successively performing, through said processing means, Fourier transformations along the first and the second space frequency axes on raw data on respective planes to form a three-dimensional hybrid data array, said processing means performing said Fourier transformations within a time interval relative to a time interval of said measuring means performing said measuring sequence such that a majority part of the Fourier transformations along the first and second spatial frequency axes is performed while said measuring sequence is being performed; and iv) performing Fourier transformations along a third spatial frequency axis on respective rows of the three-dimensional hybrid data array obtained through the step iii).

2. A magnetic resonance imaging method according to claim 1, wherein said Fourier transformations along the third space frequency axis in the step iv) are performed in a slice-to-slice order so that the multi-dimensional image data are completed slice by slice.

3. A magnetic resonance imaging method according to claim 2, further comprising a step of successively displaying images of the completed slices on a two-dimensional display screen.

4. A magnetic resonance imaging method according to claim 3, wherein an image of one of the slices is displayed while the Fourier transformations along the third space frequency axis on other of the slices are being performed.

5. A magnetic resonance imaging method according to claim 1, wherein the second spatial frequency axis is selected to have a smallest population number of data among the three spatial frequency axes.

6. In a magnetic resonance imaging system having an RF pulse transmitting means, magnetic field driving means, magnetic field controlling means receiving means and processing means, for obtaining multi-dimensional image data of an object laid in a space to which a static magnetic field is applied, a method for resolving and displaying said multi-dimensional image data along at least three image axes selected from among three axes of the space and a chemical shift axis, and for displaying images of slices along a predetermined direction preference to other directions, an imaging method comprising steps of:

a) performing a measuring sequence including the steps of:

i) exciting nuclear spins by generating RF pulses through said transmitting means, in a region within the space for plural times, the region being established by the magnetic field driving means in accordance with the magnetic field controlling means, and ii) measuring nuclear magnetic resonance signals emitted by said excited nuclear spins, said magnetic resonance signals being received through said receiving means and measured by said processing means, for plural times to successively obtain a three-dimensional raw data array on a spatial frequency domain, the three spatial frequency axes of the raw data array corresponding to respective of three-dimensional image axes of said at least three image axes, the steps of exciting nuclear spins and measuring nuclear resonance signals succeeding in a plane-to-plane order in which measurements for obtaining raw data on a present plane along a first and a second spatial frequency axes are begun after measurements for obtaining raw data on a preceding plane are finished, and the direction of those planes being selected to cross the slices predetermined to be preferentially displayed;

b) performing a three-dimensional Fourier transformation sequence to form the multi-dimensional image data, the three-dimensional Fourier transformation sequence including the steps of iii) successively performing Fourier transformations through said processing means along the first and the second space frequency axes on raw data on respective planes to form a three dimensional hybrid data array, said processing means performing said Fourier transformations within a time interval relative to a time interval of said measuring means performing said measuring sequence such that a majority of the Fourier transformations along the first and the second spatial frequency axes are performed while said measuring sequence is being performed, and iv) performing Fourier transformations along a third spatial frequency axis on respective rows of the three-dimensional hybrid data array obtained through the step iii) in a slice-to-slice order so that the multi-dimensional image data array is completed slice by slice; and c) successively displaying images of completed slices on a two-dimensional image screen.

7. A magnetic resonance imaging method for obtaining multi-dimensional image data of an object laid in a space to which a static magnetic field is applied, and for resolving said multi-dimensional image data along at least three image axes selected from among the three axes of the space and a chemical shift axis, the imaging method comprising steps of:
  a) performing a measuring sequence including the steps of:
    i) exciting nuclear spins by generating RF pulses generated through a transmitting means, in a region within the space for plural times, the region being established by a magnetic field driving means in response to a magnetic field controlling means, and
    ii) measuring nuclear magnetic resonance signals due to excited nuclear spins for plural times to successively obtain a three-dimensional raw data array on spatial frequency domain, the three spatial frequency axes of the raw data array corresponding to respective of three-dimensional image axes of said at least three image axes, the steps of exciting nuclear spins and measuring magnetic resonance signals succeeding in a plane-to-plane order in which measurements for obtaining raw data on a present plane along a first and second space frequency axes are performed line by line, after measurements for obtaining raw data on a preceding plane are finished; and
  b) performing a three-dimensional Fourier transformation sequence to form the multi-dimensional image data, the three-dimensional Fourier transformation sequence including the steps of
    iii) performing, within a processing means, a Fourier transformation along the first space frequency axis on each of lines of the raw data array each time after measurements for obtaining raw data on each of lines are accomplished,
    iv) successively performing, within said processing means, Fourier transformations along the second spatial frequency axis on data array of planes to form a three-dimensional hybrid data array, wherein the processing means performs Fourier transformations along the second spatial frequency axis on preceding planes within the hybrid data array, the preceding planes each being a plane of raw data obtained within the measuring sequence having each of its lines in the direction of the first spatial frequency axis replaced by results from the Fourier transformations along the first spatial frequency axis, while said measuring sequence is obtaining raw data on present planes, and
    v) performing Fourier transformations along a third spatial frequency axis on respective rows of the three-dimensional hybrid data array obtained through the step iv).

8. A magnetic resonance imaging method according to one of claims 6 and 7, wherein said Fourier transformations along the third space frequency axis in the step iv) are performed in a slice-to-slice order so that the multi-dimensional image data are completed slice by slice.

9. A magnetic resonance imaging method according to claim 8, further comprising a step of successively displaying images of said completed slices on a two-dimensional display screen.

10. A magnetic resonance imaging method according to one of claims 6 and 7, wherein an image of a slice is displayed while the Fourier transformations along the third space frequency axis on other slices are being performed.

11. A magnetic resonance imaging method according to one of claims 6 and 7, wherein the second spatial frequency axis is selected to have a smallest population number of data among the three spatial frequency axes.

12. A magnetic resonance imaging method for obtaining multi-dimensional image data of an object laid in a space to which a static magnetic field is applied, and for resolving said multi-dimensional image data along at least three image axes selected from among the three axes of the space and a chemical shift axis, the imaging method comprising steps of:
  a) performing a measuring sequence including the steps of
    i) exciting nuclear spins by generating RF pulses through a transmitting means, in a region within the space for plural times, the region being established by a magnetic field driving means in response to a region command output from a magnetic field controlling means, and
    ii) measuring nuclear magnetic resonance signals due to excited nuclear spins for plural times to successively obtain a three-dimensional raw data array on spatial frequency domain, the three spatial frequency axes of the raw data array corresponding to respective of said three-dimensional image axes, the steps of exciting nuclear spins and measuring magnetic resonance signals succeeding in a plane-to-plane order in which measurements for obtaining raw data on a present plane along a first and second space frequency axes are performed line by line, after measurements for obtaining raw data on a preceding plane are finished; and
  b) performing a three-dimensional Fourier transformation sequence to form the multi-dimensional image data, the three-dimensional Fourier transformation sequence including the steps of
    iii) performing, within a processing means, a Fourier transformation along the first spatial frequency axis on each of lines of the raw data array each time after measurements for obtaining raw data on each of lines are accomplished, and
    iv) successively performing, within said processing means, Fourier transformations along the second spatial frequency axis on data array of planes to form a three-dimensional hybrid data array, wherein the processing means performs Fourier transformations along the second spatial frequency axis on preceding planes within the hybrid data array, the preceding planes each being a plane of raw data obtained within the measuring sequence having each of its lines in the direction of the first spatial frequency axis replaced by results from the Fourier transformations along the first spatial frequency axis, while said measuring sequence is obtaining raw data on present planes,
    v) performing Fourier transformations along the second spatial frequency axis on data array of a last plane on which Fourier transformations along the first spatial frequency axis has been accomplished, and
    vi) performing Fourier transformations along a third spatial axis on respective rows of the three-dimensional hybrid data array obtained through the steps iv) and v).

13. A magnetic resonance imaging apparatus for obtaining multi-dimensional image data of an object laid in a space to which a static magnetic field is applied, and for resolving said multi-dimensional image data along at least three-dimensional image axes selected from three axes of the space and a chemical shift axis, comprising:

a) means for performing a measuring sequence, said means including:
   i) means for exciting nuclear spins in a region within the space for plural times, comprising an RF transmitting means, a magnetic field driving means, and a means for controlling the magnetic field driving means, and
   ii) measuring means for measuring nuclear magnetic resonance signals emitted by said excited nuclear spins, comprising a means for receiving said magnetic resonance signals and a processor for measuring said received signals, for plural times to successively obtain a three-dimensional raw data array on spatial frequency domain, three spatial frequency axes of the raw data array being respectively corresponding to respective of said three-dimensional image axes, said means for exciting nuclear spins and said measuring means having means for successively exciting nuclear spins and measuring the corresponding emitted magnetic resonance signals so as to obtain the raw data in a plane-to-plane order in which measurements for obtaining raw data on a present plane along a first and a second spatial frequency axes are begun after measurements for obtaining raw data on a preceding plane are finished; and
b) Fourier means for performing a three dimensional Fourier transformation sequence to form the multi-dimensional image data, said Fourier means including:
   i) Fourier transform array means for successively performing Fourier transformations along the first and second space frequency axes on raw data on respective planes, to form a three dimensional hybrid data array said Fourier transform array means having means for performing a majority part of the Fourier transformations along the first and second spatial frequency axes of said raw data array while said means for exciting nuclear spins and said measuring means are obtaining said raw data; and
   ii) means for performing Fourier transformations along a third spatial frequency axis on respective rows of the three-dimensional hybrid data array obtained by said Fourier transform array means.

14. A magnetic resonance imaging apparatus for obtaining multi-dimensional image data of an object laid in a space to which a static magnetic field is applied, said multi-dimensional image data being resolved along at least three-dimensional image axes selected from three axes of the space and a chemical shift axis, and for displaying images of slices along a predetermined direction preference to other directions, comprising:

a) means for performing a measuring sequence including:
   i) means for exciting nuclear spins in a region within the space for plural times, comprising an RF transmitting means, a magnetic field driving means, and a means for controlling the magnetic field driving means, and
   ii) measuring means for measuring nuclear magnetic resonance signals emitted by said excited nuclear spins, comprising a means for receiving said magnetic resonance signals and a processor for measuring said received signals, for plural times to successively obtain a three-dimensional raw data array on spatial frequency domain, three spatial frequency axes of the raw data array being respectively corresponding to respective of said three-dimensional image axes, said means for exciting nuclear spins and said measuring means having means for successively exciting nuclear spins and measuring the corresponding emitted magnetic resonance signals so as to obtain the raw data in a plane-to-plane order in which measurements for obtaining raw data on a present plane along a first and a second spatial frequency axes are begun after measurements for obtaining raw data on a preceding plane are finished, and the direction of those planes being selected to cross the slices predetermined to be preferentially displaced;
b) Fourier means for performing a three-dimensional Fourier transformation sequence to form the multi-dimensional image data, said Fourier means including:
   i) Fourier transform array means for successively performing Fourier transformations along the first and the second space frequency axes on the raw data on respective planes to form a three dimensional hybrid data array, said Fourier transform array means having means for performing a majority part of the Fourier transformations along the first and the second spatial frequency axes while said means for performing a measuring sequence measures nuclear magnetic resonance signals; and
   ii) image means for performing Fourier transformations along a third spatial frequency axis, in a slice-to-slice order, on respective rows of the three-dimensional hybrid data array obtained by said Fourier transform array means, and generating a multi-dimensional image data array in a corresponding slice-to-slice order; and
   iii) means for successively displaying images of slices of said image data array on a two-dimensional image screen.

15. A magnetic resonance imaging apparatus for obtaining multi-dimensional image data of an object laid in a space to which a static magnetic field is applied, said multi-dimensional image data being resolved along at least three-dimensional image axes selected from three axes of the space and a chemical shift axis, comprising:

a) means for performing a measuring sequence including:
   i) means for exciting nuclear spins in a region within the space for plural times, comprising an RF transmitting means, a magnetic field driving means, and a means for controlling the magnetic field driving means, and
   ii) measuring means for measuring nuclear magnetic resonance signals emitted by the excited nuclear spins, comprising a means for receiving said magnetic resonance signals and a processor for measuring said received signals, for plural times to successively obtain a three-dimensional raw data array on spatial frequency domain, three spatial frequency axes of the raw data array respectively corresponding to said three-dimensional image axes, said means for exciting nuclear spins and said measuring means having means for successively exciting nuclear spins and measuring the corresponding emitted magnetic resonance signals so as to obtain the raw data in a plane-to-plane order and means for performing measurements for obtaining raw data on a present plane along a first and second space frequency axes in a line-by-line manner, after measurements for obtaining raw data on a preceding plane are finished; and b) a processor for performing a three-dimensional Fourier transformation sequence to form a multi-dimensional image data, said processor including:
  i) first axis Fourier means for performing a Fourier transformation along the first spatial frequency axis on each of the lines of the raw data array obtained by said measuring means to form a hybrid data array consisting of said raw data array with lines thereof replaced by the corresponding Fourier transform data generated by said first axis Fourier means;
  ii) second axis Fourier means for successively performing Fourier transformations along the second spatial frequency axis of a preceding data plane within said hybrid data array, the preceding plane being a plane of raw data obtained within the measuring sequence having each of its lines in the direction of the first spatial frequency axis replaced by data generated by the means for performing Fourier transformations along the first spatial frequency axis, while said measuring means is concurrently obtaining raw data on a present plane within said hybrid data array; and
  iii) third axis Fourier means for performing Fourier transformations along a third spatial frequency axis on respective rows of the three-dimensional hybrid data array formed by said first and second axis Fourier means.

16. A magnetic resonance imaging apparatus for obtaining multi-dimensional image data of an object laid in a space to which a static magnetic field is applied, said multi-dimensional image data being resolved along at least three-dimensional image axes selected from three axes of the space and a chemical shift axis, comprising:
  a) means for performing a measuring sequence including:
    i) means for exciting nuclear spins in a region within the space for plural times, comprising an RF transmitting means, a magnetic field driving means, and a means for controlling the magnetic field driving means, and
    ii) measuring means for measuring nuclear magnetic resonance signals due to excited nuclear spins for plural times to successively obtain a three-dimensional raw data array on spatial frequency domain, three spatial frequency axes of the raw data array respectively corresponding to respective of said three-dimensional image axes, said measuring means having means for performing plural time measurements in a plane-to-plane order and means for performing measurements for obtaining raw data on a present plane along a first and second space frequency axes in a line-by-line manner, after measurements for obtaining raw data on a preceding plane are finished; and
  b) Fourier means for performing a three-dimensional Fourier transformation sequence to form a multi-dimensional image data, said Fourier means including
    i) first axis Fourier means for performing a Fourier transformation along the first spatial frequency axis on each of the lines of the raw data array obtained by said measuring means to form a hybrid data array consisting of said raw data array with lines thereof replaced by the corresponding Fourier transform data generated by said first axis Fourier means;
    ii) second axis Fourier means for successively performing Fourier transformations along the second spatial frequency axis of a preceding data plane within said hybrid data array, the preceding plane being a plane of raw data obtained within the measuring sequence having each of its lines in the direction of the first spatial frequency axis replaced by data generated by the means for performing Fourier transformations along the first spatial frequency axis, while said measuring means is concurrently obtaining raw data on the present plane;
    iii) last plane Fourier means for performing Fourier transformations along the second spatial frequency axis of a last plane of said hybrid data array, after said last plane is Fourier transformed along the first spatial frequency axis by said first Fourier means; and
    iv) third axis Fourier means for performing Fourier transformations along a third spatial axis on respective rows of said three-dimensional hybrid data array generated by said first axis, second axis and last plane Fourier means.

* * * * *